(12) United States Patent
Jang

(10) Patent No.: US 7,687,353 B2
(45) Date of Patent: Mar. 30, 2010

(54) ION IMPLANTATION METHOD FOR HIGH VOLTAGE DEVICE

(75) Inventor: Duck Ki Jang, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/948,803

(22) Filed: Nov. 30, 2007

(65) Prior Publication Data

US 2008/0160704 A1 Jul. 3, 2008

(30) Foreign Application Priority Data

Dec. 29, 2006 (KR) .................. 10-2006-0137354

(51) Int. Cl.
*H01L 21/8236* (2006.01)

(52) U.S. Cl. .................. 438/276; 438/199; 438/289; 438/911; 438/275; 257/E21.618

(58) Field of Classification Search .................. 438/276, 438/275, 257, 201, 199, 289
See application file for complete search history.

(56) References Cited

U.S. PATENT DOCUMENTS

| | | | | |
|---|---|---|---|---|
| 5,834,352 A | * | 11/1998 | Choi | 438/275 |
| 5,946,575 A | * | 8/1999 | Yamaoka et al. | 438/276 |
| 6,043,128 A | * | 3/2000 | Kamiya | 438/289 |
| 6,159,799 A | * | 12/2000 | Yu | 438/257 |
| 6,174,759 B1 | * | 1/2001 | Verhaar et al. | 438/201 |
| 6,576,521 B1 | * | 6/2003 | Chaudhry et al. | 438/303 |
| 6,939,757 B2 | * | 9/2005 | Kim | 438/199 |
| 2005/0006709 A1 | * | 1/2005 | Asai et al. | 257/370 |
| 2005/0255644 A1 | * | 11/2005 | Ohkawa | 438/197 |
| 2005/0280000 A1 | * | 12/2005 | Ishii et al. | 257/67 |
| 2006/0138555 A1 | * | 6/2006 | Miyano | 257/374 |
| 2008/0003734 A1 | * | 1/2008 | Chuang et al. | 438/199 |
| 2008/0248623 A1 | * | 10/2008 | Tsai et al. | 438/276 |

* cited by examiner

*Primary Examiner*—Matthew Smith
*Assistant Examiner*—Wilner Jean Baptiste
(74) *Attorney, Agent, or Firm*—Workman Nydegger

(57) ABSTRACT

A method of performing ion implantation method for a high-voltage device. The method includes defining a logic region and a high-voltage region in a semiconductor substrate, forming a first gate insulation layer on the semiconductor substrate in the logic region and a second gate insulation layer on the semiconductor substrate in the high-voltage region, the second gate insulation layer being thicker than the first gate insulation layer, forming a hollow region in the logic region and a source region in the high-voltage region by implanting first conductive impurities into the logic region and source regions of the semiconductor substrate, and forming a second conductive impurity layer in the logic region by implanting second conductive impurities logic region of the into the semiconductor substrate.

14 Claims, 3 Drawing Sheets

PRIOR ART

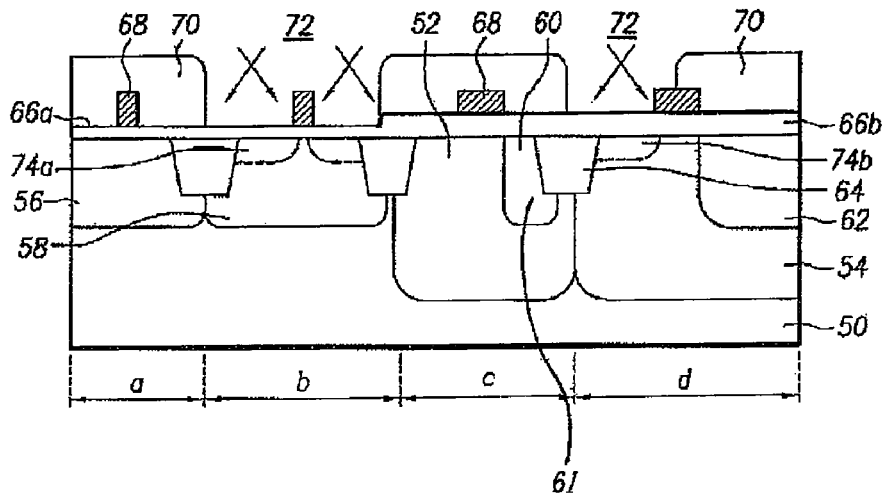
FIG. 4
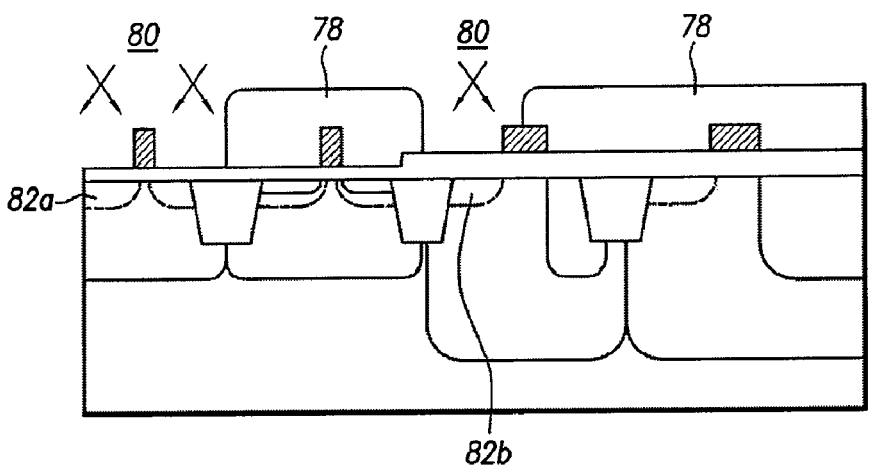
FIG. 5
FIG. 6

ION IMPLANTATION METHOD FOR HIGH VOLTAGE DEVICE

CROSS-REFERENCES AND RELATED APPLICATIONS

This application claims the benefit of the Korean Patent Application No. 10-2006-0137354, filed on 29 Dec. 2006, which is hereby incorporated by reference in its entirety.

BACKGROUND OF THE INVENTION

1. Field of the Invention

The present invention relates to a method for manufacturing a high-voltage semiconductor device. More particularly, the present invention relates to an ion implantation method for forming a high-voltage device.

2. Discussion of the Related Art

Generally, semiconductor devices which are capable of operating at high voltages include a high-voltage transistor capable of operating in a high-voltage environment, and a second low-voltage transistor constituting a logic circuit.

A high-voltage transistor requires a resistance against a high voltage, and has a structure with high breakdown voltage and voltage/current control characteristics. Examples of high-voltage transistor structures include double-diffusion structures, lateral-diffusion structures, expanded drain structures, and the like. By way of comparison, the second low-voltage transistor constituting a logic circuit requires rapid operational characteristics including high-integration properties and low-electricity requirements. Typically, the low-voltage transistor has a hollow junction structure which exhibits superior short channel effects and hot carrier characteristics.

The low-voltage transistor of the logic circuit and the high-voltage transistor have different gate insulation thicknesses. Generally, the gate insulation layer in a logic region has a thickness of approximately 20 Å, while the gate insulation layer in the high-voltage region has a thickness of approximately 140 Å. Because of the different thicknesses in the gate insulation layers in the low-voltage and high-voltage transistors, it is difficult to form a transistor junction in the high-voltage region using the ion implantation process used for forming a transistor junction in the logic circuit. Thus, there is a need for separate masking processes in order to form the junction of the logic circuit and the junction in the high-voltage region.

Because the photolithography processes used a semiconductor manufacturing method are very costly and time-consuming, it is necessary to reduce the number of the processes in order to enhance productivity. Thus, forming an impurity diffusion layer in both the logic region and the high-voltage region using separate ion implantation processes, which have the same conductivity and density conditions using different ion implantation masks results in enormous losses in both time and cost. For this reason, there is an urgent need for a method of a simplified manufacturing process which overcomes the previously described problem.

BRIEF SUMMARY OF THE INVENTION

Accordingly, the present invention is directed to an ion implantation method for a high-voltage device that substantially obviates one or more problems, limitations, or disadvantages of the related art.

An object of the present invention is to provide an ion implantation method for manufacturing a high-voltage device, which can reduce the number of ion implantation masks used to form the device.

Another object of the present invention is to provide an ion implantation method for a high-voltage device, which can simultaneously form an impurity diffusion layer in a logic region and high-voltage region.

To achieve these objects and other advantages and in accordance with the purpose of the invention, one aspect of the invention is an ion implantation method for manufacturing a high-voltage device. The method comprises defining a logic region and a high-voltage region in a semiconductor substrate, forming a first gate insulation layer on the semiconductor substrate in the logic region and a second gate insulation layer on the semiconductor substrate in the high-voltage region, the second gate insulation layer being thicker than the first gate insulation layer; forming a hollow region in the logic region and a source region in the high-voltage region by implanting first conductive impurities into the semiconductor substrate; and forming a second conductive impurity layer in the logic region by implanting second conductive impurities into the semiconductor substrate. The present invention can form a hollow region and an impurity layer in a logic region, and a source region in a high-voltage region by use of the same ion implantation mask, thereby reducing the number of a mask process from two times to one time.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this application. The drawings illustrate embodiment(s) of the invention and together with the description serve to explain the principle of the invention. In the drawings:

FIGS. 4 to 7 are sectional views illustrating an ion implantation method for a high-voltage device according to an embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
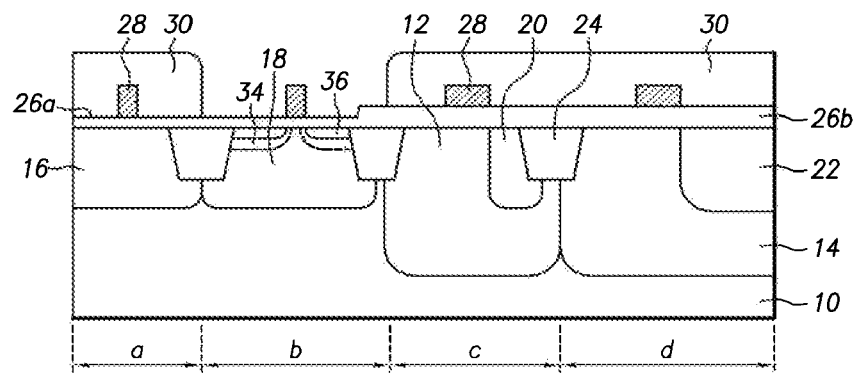
FIGS. 1 to 3 are sectional views illustrating an ion implantation method for a high-voltage device known in the prior art.
Figure 2:
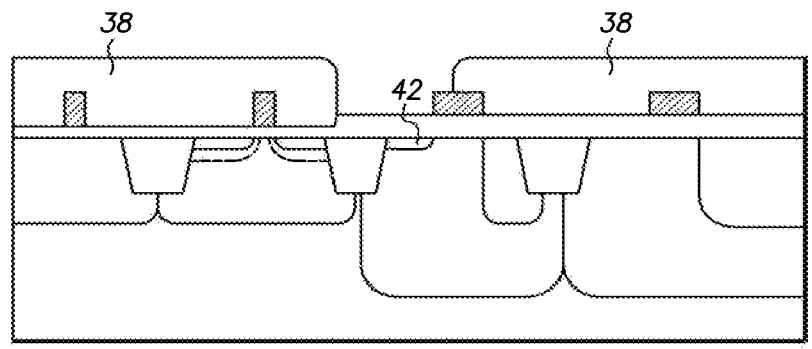
Figure 3:
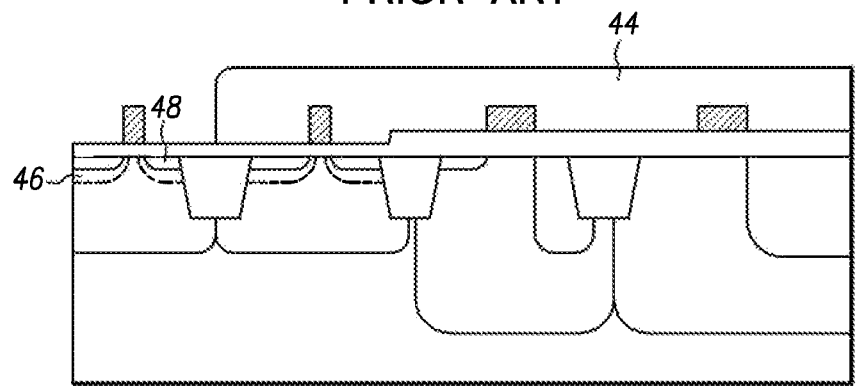

FIGS. 1 to 3 are sectional views illustrating an ion implantation method for a high-voltage device known in the prior art. Here, reference numeral "28" represents a gate electrode, and reference numeral "20" represents a drift region.

As shown in FIG. 1, a high-voltage device typically comprises a logic region formed on a semiconductor substrate 10. The logic region consists of a logic N-type metal oxide semiconductor (NMOS) region "a" and a logic P-type metal oxide semiconductor (PMOS) region "b," and a high-voltage region comprised of a high-voltage NMOS region "c" and a high-voltage PMOS region "d." The high-voltage region in the semiconductor substrate 10 includes a high-voltage p-well region 12 and a high-voltage n-well region 14, while the logic region in the semiconductor substrate 10 includes a logic p-well region 16 and a logic n-well region 18.

Because of the different operating characteristics between the transistor in the logic region and the transistor in the high-voltage region, the high-voltage p-well region 12 and n-well region 14 have different depths than the logic p-well region 16 and n-well region 18.

A device isolation layer 24 is formed in the semiconductor substrate 10 in order to define the active region. A gate insulation layer 24 is formed in the active region. Specifically, the logic region has a relatively thin first gate insulation layer 26a, while the high-voltage region has a second gate insulation layer 26b that is thicker than the first gate insulation layer 26a.

According to the method of the prior art, the different thickness of the second gate insulation layer 26b in the logic region and first gate insulation layer 26a of high-voltage region means that the lightly doped drain (LDD) regions in the logic and high-voltage regions cannot be formed simultaneously. Thus, as shown, a first mask pattern 30 is formed on the semiconductor substrate 10 to expose the logic n-well region 18 of the logic PMOS region "b." Then, impurities are implanted into the semiconductor substrate 10 in order to form a n-type hollow region 34 and a logic p-LDD region 36.

Then, as shown in FIG. 2, the first mask pattern 30 is removed, and a second mask pattern 38 is formed which exposes the high-voltage p-well region 12 of the high-voltage NMOS region "c." Then, impurities are implanted into the semiconductor substrate 10 in order to form a high-voltage n-LDD region 42. In this case, the implantation energy of impurity ions must be high enough to implant impurities through the thick second gate insulation layer 26b.

Then, as shown in FIG. 3, the second mask pattern 38 is removed, and a third mask pattern 44 is formed which exposes the logic NMOS region "a." As impurities are implanted into the semiconductor substrate 10, the third mask pattern 44 is used as an ion implantation mask, in order to form a p-type hollow region 46 and a logic n-LDD region 48. In this case, the ion implantation energy required to form the logic n-LDD region 48 is relatively low because impurities are implanted through the thin first gate insulation layer 26a. Accordingly, even if the LDD region in the logic region and the LDD region in the high-voltage region have the same impurities and densities, they require different ion energy energies. Therefore, it is necessary to use the second mask pattern and the third mask pattern to form both LDD regions.

FIGS. 4 to 7 are sectional views illustrating a method for performing ion-implantation in a high-voltage device according to an embodiment of the present invention. Here, reference numeral "61" represents a drift region.

First, as shown in FIG. 4, a semiconductor substrate 50 is divided into a logic region, which includes a logic NMOS region "a" and a logic PMOS region "b," and a high-voltage region which includes a high-voltage PMOS region "c" and a high-voltage NMOS region "d." The high-voltage region in the semiconductor substrate 50 includes a high-voltage n-well region 52 and a high-voltage p-well region 54, while the logic region of the semiconductor substrate 50 includes a logic p-well region 56 and a logic n-well region 58. Similar to the prior art, because of the different operating characteristics between a transistor in the logic region and high-voltage region, the high-voltage p-well region and the high-voltage n-well region have different depths than the p-well and n-well region of the logic region.

A device isolation layer 64 is formed in the semiconductor substrate 50 to define active regions. A gate insulation layer is formed in the active regions. The logic region "a" and "b" have a relatively thin first gate insulation layer 66a, and the high-voltage region "c" and "d" have a relatively thicker second gate insulation layer 66b than the first gate insulation layer 66a. The first gate insulation layer 66a in the logic region may have a thickness of approximately 20 Å, while the second gate insulation layer 66b in the high-voltage region may have a thickness of approximately 140 Å. The gate electrodes 68 are formed on the first gate insulation layer 66a and the second gate insulation layer 66b.

In order to form a transistor junction in the logic PMOS region "b" and a transistor junction in the high-voltage NMOS region "d," a first mask pattern 70 is formed on the semiconductor substrate. The logic PMOS region "b" and the high-voltage NMOS region "d" are exposed by the first mask pattern 70.

N-type impurities 72 are implanted into the logic PMOS region "b" and the high-voltage NMOS region "d" using the first mask pattern 70. As the n-type impurities are implanted into the semiconductor substrate 50, a n-type hollow region 74a is formed adjacent to the gate electrode 68 in the logic n-well region 58 of the logic PMOS region "b." A n-type source region 74b is formed adjacent to the gate electrode 68 in the high-voltage p-well region 54 of the high-voltage NMOS region "d." In this examples, the n-type impurities are implanted into the substrate by a tilt ion implantation method, so as to be diffused in a lateral direction below the gate electrode 68. Using this process the electric field is distributed in the junction. A hollow region has a deeper depth than the LDD region. Accordingly, while the hollow region 74a is formed in the logic PMOS region "b," the impurities may permeate into the substrate in the high-voltage NMOS region "d" by passing through the second gate insulation layer 66b, so as to form the n-type source region 74b in the substrate. The n-type impurities may be implanted by energy of between 40 keV and 60 keV.

Then, as shown in FIG. 5, p-type impurities 75 are implanted into the semiconductor substrate 50 using the first mask pattern 70 as an ion implantation mask. In this case, since the p-type impurities are implanted using a relatively low energy of only a few keV, the p-type impurities do not extend into the semiconductor substrate 50 through the second gate insulation layer 66b, and are only implanted in the semiconductor substrate 50 in the logic PMOS region "b." As a result, a p-LDD region 76 may be formed in the logic PMOS region "b" in the n-type hollow region 74a. The p-type impurities are implanted perpendicular to the surface of the substrate so as to restrict the lateral diffusion of the impurities, and thus, may be formed in the n-type hollow region 74a.

Then, as shown in FIG. 6, the first mask pattern 70 is removed, and a second mask pattern 78 is formed on the semiconductor substrate 50. The logic NMOS region "a" and the high-voltage PMOS region "c" are exposed by the second mask pattern 78.

P-type impurities 80 are implanted into the logic NMOS region "a" and high-voltage PMOS region "c" using the second mask pattern 78. As the p-type impurities are implanted into the semiconductor substrate 50, a p-type hollow region 82a is formed adjacent to the gate electrode 68 in the logic p-well region 56 of the logic NMOS region "a," and a p-type source region 82b is formed adjacent to the gate electrode 68 in the high-voltage n-well region 52 of the high-voltage PMOS region "c." In this example, the p-type impurities are implanted into the substrate using a tilt ion implantation method so as to diffused the impurities in a lateral direction below the gate electrode 68. This has the effect of distributing an electric field in the junction. The hollow region has a depth that is greater than the depth of the LDD region. Accordingly, when the hollow region 82a is formed in the logic NMOS region "a," the impurities permeate into the substrate in the high-voltage PMOS region "c" by passing through the second gate insulation layer 66b, forming the p-type source region 82b in the substrate. The p-type impurities may be implanted using an energy of between 50 keV and 70 keV.

Figure 7:
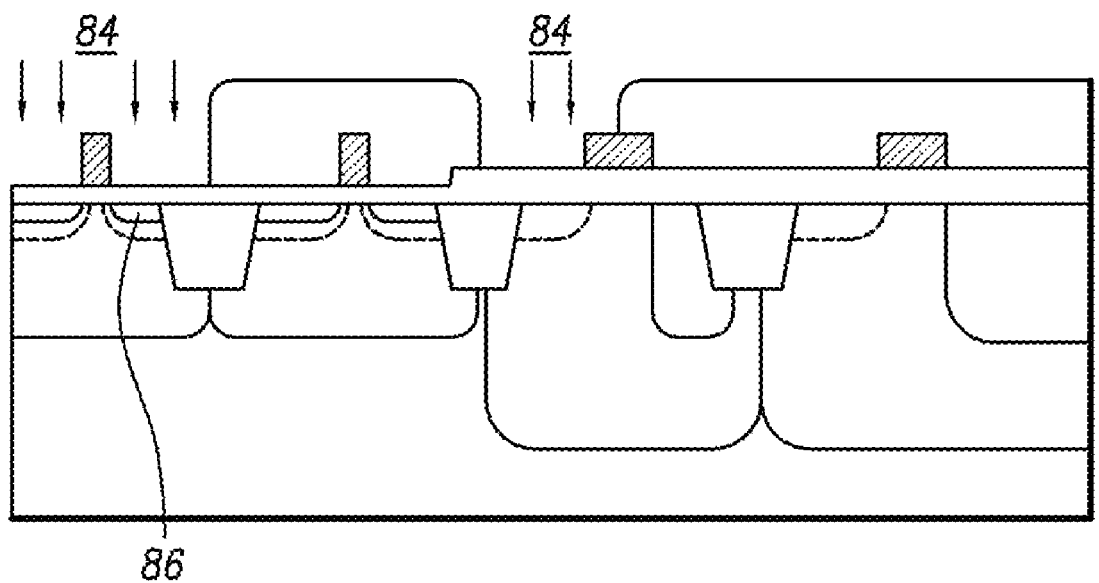

Then, as shown in FIG. 7, n-type impurities 84 are implanted into the semiconductor substrate 50 using the second mask pattern 78 as an ion implantation mask. In this example, since the n-type impurities are implanted using a relatively low energy of only a few keV, the n-type impurities are prevented from passing through the second gate insulation layer 66b, and are implanted only into the semiconductor substrate in the logic NMOS region "a." As a result, a n-LDD region 86 may be formed in the logic NMOS region "a." More particularly, the n-LDD region 86 is formed in the p-type hollow region 82a of the logic NMOS region "a." The n-type impurities are implanted perpendicular to the substrate surface so as to restrict the lateral diffusion of the impurities, and thus, may be formed in the p-type hollow region 82a.

As apparent from the above description, the hollow region in a logic NMOS transistor and a source region in a high-voltage PMOS transistor of the present invention are simultaneously formed using the same first ion implantation mask, and a hollow region in a logic PMOS transistor and a source region in a high-voltage NMOS transistor are simultaneously formed using the same second ion implantation mask. As a result, the number of a mask processes required to implant ions into the logic region and the high-voltage region can be reduced.

When impurity ions are implanted into the logic region using a low ion implantation energy, a thick gate insulation layer in the high-voltage region prevents the impurity ions from being diffusing into the substrate in the high-voltage region. As a result, the same ion implantation mask can be used to form the source region in the high-voltage region, while forming a first conductive hollow region and second conductive LDD region in the logic region.

In conclusion, the present invention has a reduced number of an ion implantation mask processes, resulting in a significant reduction in manufacturing cost and time.

It will be apparent to those skilled in the art that various modifications and variations can be made in the present invention without departing from the spirit or scope of the inventions. Thus, it is intended that the present invention covers the modifications and variations of this invention that come within the scope of the appended claims and their equivalents.

What is claimed is:

1. An ion implantation method for forming a high-voltage device, the method comprising:
    defining a logic region and a high-voltage region in a semiconductor substrate;
    forming a first conductive well region in the logic region;
    forming a second conductive well region in the high-voltage region;
    forming a first gate insulation layer on the semiconductor substrate in the logic region and a second gate insulation layer on the semiconductor substrate in the high-voltage region, the second gate insulation layer being thicker than the first gate insulation layer;
    forming a mask pattern which exposes the first conductive well region in the logic region and the second conductive well region in the high-voltage region;
    simultaneously forming a hollow region in the logic region, and a source region in the high-voltage region, by simultaneously implanting first conductive impurities into the logic region and source region of the semiconductor substrate using the mask pattern as an ion implantation mask; and
    forming a second conductive impurity layer in the hollow region by implanting second conductive impurities into the logic region and the source region in the high-voltage region using the mask pattern as an ion implantation mask, wherein the second gate insulation layer prevents the implantation of ions in the source regions of the semiconductor substrate.

2. The method according to claim 1, wherein the second gate insulation layer in the high-voltage region of the semiconductor substrate confines the implantation of the second conductive impurities to the logic region of the semiconductor substrate.

3. The method according to claim 1,
    wherein the hollow region is formed in the first conductive well region, and the source region is formed in the second conductive well region.

4. The method according to claim 1, wherein the second conductive impurities are projected to a depth that is smaller than the thickness of the second gate insulation layer.

5. The method according to claim 1, wherein the depth of the second conductive impurity layer is smaller than the depth of the hollow region.

6. The method according to claim 5, wherein the second conductive impurity layer is formed in the hollow region of the logic region.

7. The method according to claim 1, wherein:
    the hollow region in a logic N-type metal oxide semiconductor NMOS transistor and the source region in a high-voltage P-type metal oxide semiconductor (PMOS) transistor are simultaneously formed simultaneously using a first ion implantation mask; and
    the hollow region in a logic PMOS transistor and the source region in a high-voltage NMOS transistor are simultaneously formed using a second ion implantation mask.

8. The method according to claim 7, further comprising:
    forming a N-diffusion region in the logic NMOS transistor using the first ion implantation mask; and
    forming a P-diffusion region in the logic PMOS transistor using the second ion implantation mask,
    wherein the second gate insulation layer prevents the implantation of ions in the source regions in the high-voltage PMOS transistor and high-voltage NMOS transistor of the semiconductor substrate.

9. An ion implantation method for forming a high-voltage device, the method comprising:
    defining a logic region and a high-voltage region in a semiconductor substrate;
    forming a first conductive well region in the logic region;
    forming a second conductive well region in the high-voltage region;
    forming a first gate insulation layer on the semiconductor substrate in the logic region and a second gate insulation layer on the semiconductor substrate in the high-voltage region, the second gate insulation layer being thicker than the first gate insulation layer;

forming mask pattern which exposes the first conductive well region in the logic region and the second conductive well region in the high-voltage region;

simultaneously forming a hollow region comprising a N-type metal oxide semiconductor NMOS transistor in the logic region, and a source region comprising a P-type metal oxide semiconductor (PMOS) transistor in the high-voltage region, by simultaneously implanting first conductive impurities into the logic region and source region of the semiconductor substrate using the mask pattern as an ion implantation mask; and forming a second conductive impurity layer in the hollow region of the logic region by implanting second conductive impurities into the logic region and the source region in the high-voltage region using the mask pattern as an ion implantation mask, wherein the second gate insulation layer prevents the implantation of ions in the source regions of the semiconductor substrate.

10. The method according to claim 9, wherein the second gate insulation layer in the high-voltage region of the semiconductor substrate confines the implantation of the second conductive impurities to the logic region of the semiconductor substrate.

11. The method according to claim 9, wherein the hollow region is formed in the first conductive well region, and the source region is formed in the second conductive well region.

12. The method according to claim 9, wherein the second conductive impurities are projected to a depth that is smaller than the thickness of the second gate insulation layer.

13. The method according to claim 9, wherein the depth of the second conductive impurity layer is smaller than the depth of the hollow region.

14. The method according to claim 9, further comprising:

forming a N-diffusion region in the logic NMOS transistor using the first ion implantation mask; and forming a P-diffusion region in the logic PMOS transistor using the second ion implantation mask, wherein the second gate insulation layer prevents the implantation of ions in the source regions in the high-voltage PMOS transistor and high-voltage NMOS transistor of the semiconductor substrate.

* * * * *